(12) United States Patent
Chang

(10) Patent No.: US 7,053,421 B2
(45) Date of Patent: May 30, 2006

(54) LIGHT-EMITTING DIODE

(75) Inventor: Chih-Chin Chang, Hsin-Chu (TW)

(73) Assignee: Lighthouse Technology Co., LTD, Hsin-Chu Hsien (TW)

( * ) Notice: Subject to any disclaimer, the term of this patent is extended or adjusted under 35 U.S.C. 154(b) by 331 days.

(21) Appl. No.: 10/707,443

(22) Filed: Dec. 15, 2003

(65) Prior Publication Data

US 2005/0127387 A1 Jun. 16, 2005

(51) Int. Cl.
*H01L 33/00* (2006.01)

(52) U.S. Cl. .......................... 257/102; 257/91; 257/98; 257/99; 257/88

(58) Field of Classification Search ................ 257/100, 257/101, 102, 92, 98, 107
See application file for complete search history.

(56) References Cited

U.S. PATENT DOCUMENTS 6,582,643 B1  6/2003  Brunnhofer

FOREIGN PATENT DOCUMENTS

| JP | 2001-196641 | * | 7/2001 |
| JP | 2002-76161 | * | 3/2002 |
| TW | 474030 | | 1/2002 |
| TW | 521409 | | 2/2003 |

* cited by examiner

*Primary Examiner*—Nathan J. Flynn
*Assistant Examiner*—Fazli Erdem
(74) *Attorney, Agent, or Firm*—Winston Hsu (57) ABSTRACT

A light-emitting diode (LED) mainly includes a surface mounted package. The surface mounted package includes a substrate, two composite metal layers positioned on the substrate and being insulated from each other, an LED chip electrically connected to the composite metal layers, and a sealing member covering the LED chip. Each of the composite metal layers has a silver layer for preventing solder paste from penetrating into space between the sealing member and the composite metal layers and for reflecting light beams generated by the LED chip.

16 Claims, 8 Drawing Sheets

LIGHT-EMITTING DIODE

BACKGROUND OF INVENTION

1. Field of the Invention

The present invention relates to a light-emitting diode (LED), and more specifically, to a surface mounted light-emitting diode with high luminous intensity and excellent structural intensity.

2. Description of the Prior Art

Since a light-emitting diode (LED) has the advantages of a long lifetime, a small size, high resistance to earthquakes, and a low consumption of electric power, the LED is widely applied in a pilot lamp or a light source of various household appliances and instruments. Additionally, the LED is developed toward full colors and high brightness, so that the LED is further applied in large-sized display signboards and traffic lights, and it may be substituted for tungsten lamps and mercury lamps in the future.

Figure 1:
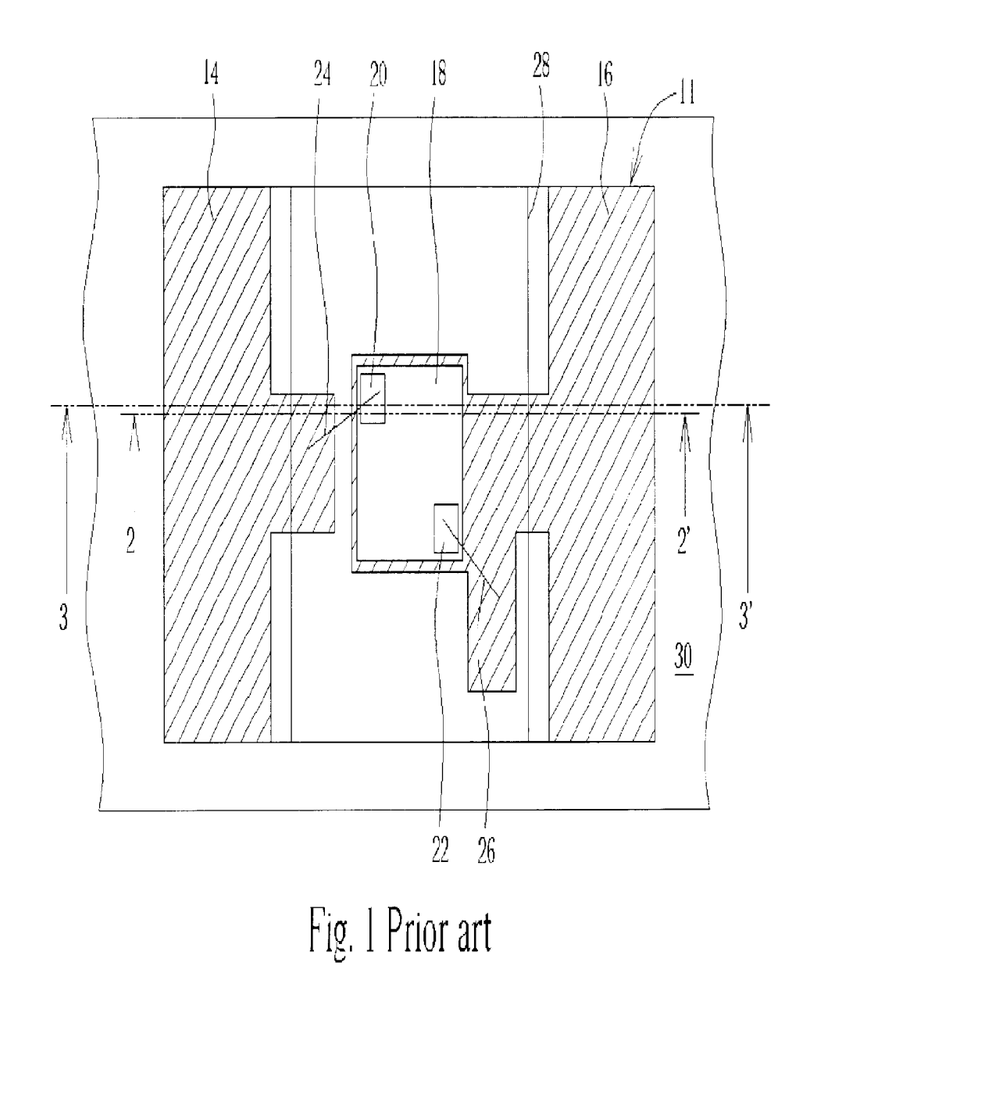
FIG. 1 is a top view of an LED according the prior art.
Figure 2:
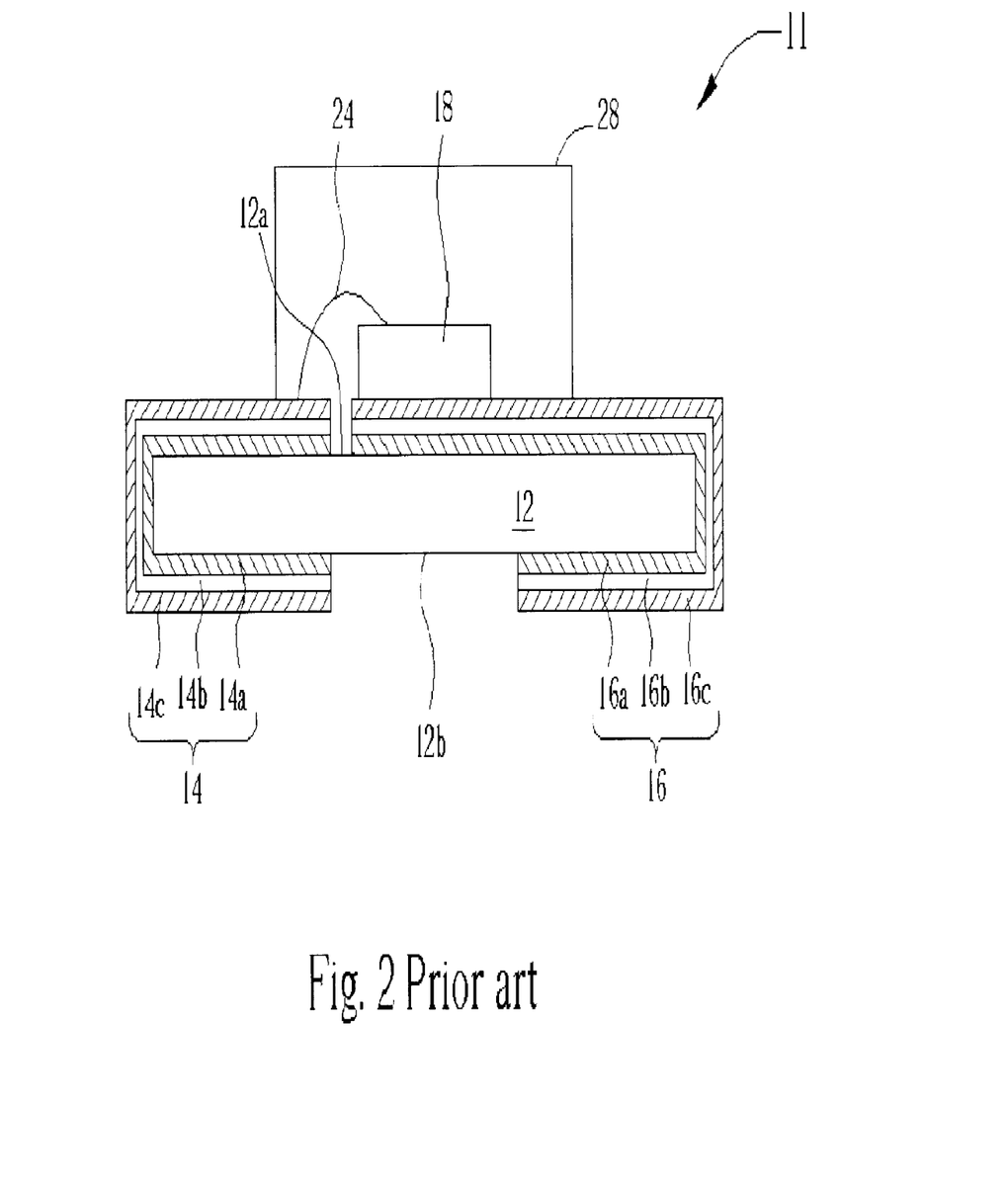
FIG. 2 is a sectional view along line 2—2 of the LED shown in FIG. 1.
Figure 3:
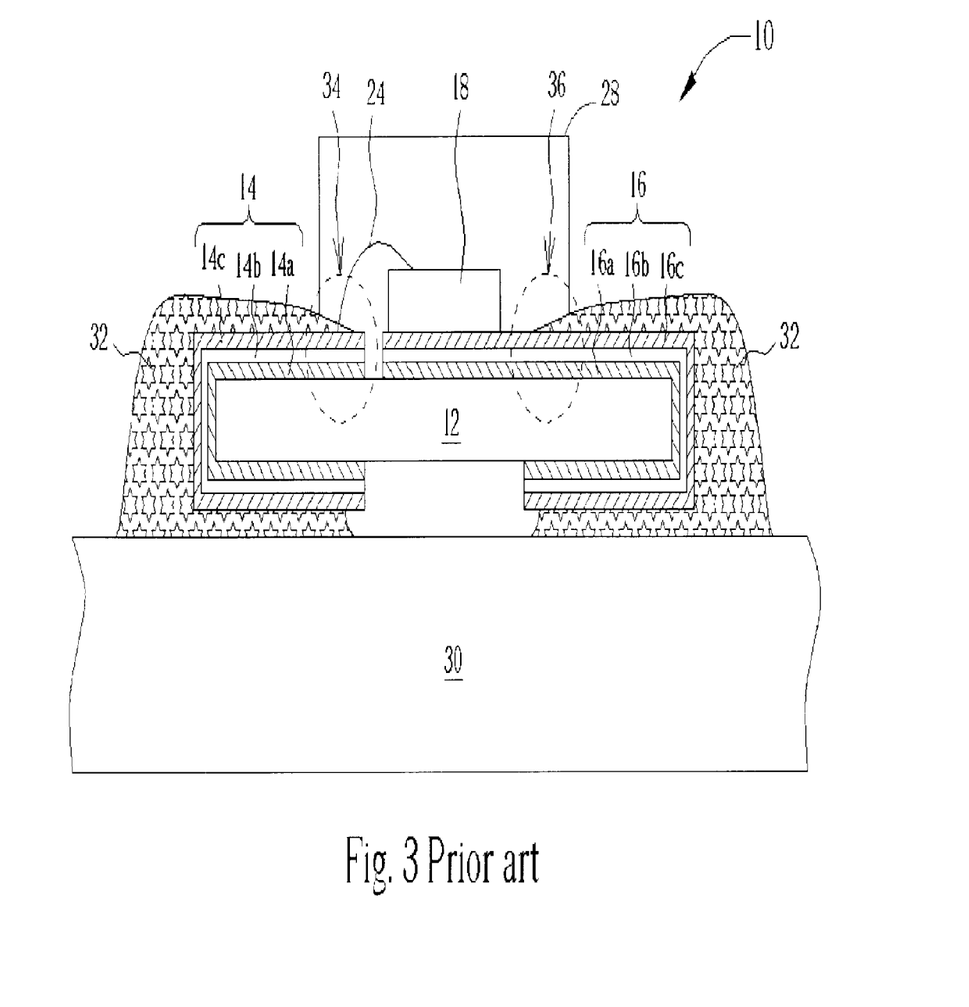
FIG. 3 is the sectional view along line 3—3 of the LED shown in FIG. 1.

Please refer to FIG. 1 to FIG. 3. FIG. 1 is a top view of an LED according the prior art. FIG. 2 is a sectional view along line 2—2 of the LED shown in FIG. 1. FIG. 3 is the sectional view along line 3—3 of the LED shown in FIG. 1. As shown in FIG. 1, an LED 10 comprises a printed circuit board 30, and a surface mounted package 11 positioned on the printed circuit board 30. As shown in FIG. 2, the surface mounted package 11 includes a substrate 12 having an upper surface 12a and a lower surface 12b, two composite metal layers 14 and 16 that are insulated from each other and positioned on the substrate 12, an LED chip 18 electrically connected to the composite metal layers 14 and 16, and a sealing member 28 located on the substrate 12 and covering the LED chip 18. As shown in FIG. 1, the LED chip 18 has a p-electrode 20 electrically connected to the composite metal layer 14 through a gold wire 24, and an n-electrode 22 electrically connected to the composite metal layer 16 through a gold wire 26. The p-electrode 20 and the n-electrode 22 are used to receive a driving voltage, so that electrons in the LED chip 18 can be driven by the driving voltage to combine with holes at PN junction for emitting light beams. As shown in FIG. 2, the composite metal layer 14 includes a copper layer 14a positioned on the substrate 12 and extending from the upper surface 12a to the lower surface 12b, a nickel layer 14b positioned on the copper layer 14a, and a gold layer 14c located on the nickel layer 14b. Likewise, the composite metal layer 16 also includes a copper layer 16a, a nickel layer 16b, and a gold layer 16c. Additionally, the substrate 12 comprises a plastic substrate or a ceramic substrate. The sealing member 28 comprises transparent epoxy, and it is used to protect the LED chip 18, and the gold wires 24 and 26.

As shown in FIG. 3, the LED 10 further comprises a plurality of solder paste layers 32 for fixing and electrically connecting the surface mounted package 11 to the printed circuit board 30, and the solder paste layers 32 are not shown in FIG. 1 but shown in FIG. 3 for avoiding confusion. The printed circuit board 30 is used to input the driving voltage to the LED chip 18 for driving the LED chip 18 to emit light beams. The solder paste layers 32 are used to electrically connect the printed circuit board 30 to the gold layer 14c and the gold layer 16c that are positioned on the lower surface 12b. Additionally, the driving voltage supplied by the printed circuit board 30 is input into the p-electrode 20 and the n-electrode 22 through the composite metal layers 14 and 16, and then, the electrons and the holes in the LED chip 18 are driven to be combined at PN junction by the driving voltage for emitting light beams.

As shown in FIG. 3, due to intrinsic characteristics of materials, a binding force between the solder paste layers 32 and the gold layers 14c and 16c is much larger than that between the sealing member 28 and the gold layers 14c and 16c. Accordingly, the sealing member 28 cannot be bonded to the gold layers 14c and 16c quite well, and cracks may be formed between the sealing member 28 and the gold layers 14c and 16c. As the cracks are formed, the solder paste layers 32 would penetrate into space between the sealing member 28 and the substrate 12, as indicated by arrows 34 and 36. Unfortunately, the penetrating solder paste layers 32 may separate the sealing member 28 from the substrate 12, and furthermore, the penetrating solder paste layers 32 may make the gold wires 24 and 26 be broken so the LED chip 18 cannot be driven to emit light beams. Additionally, the gold layers 14c and 16c reflect all kinds of light beams except visible light and light beams whose wavelength is shorter than 400 nm, so that brightness may be degraded when the LED chip 18 is driven to emit light beams of short wave-lengths. Furthermore, because of intrinsic characteristics of materials, a combination between the gold layer 14c and the copper layer 14a is so poor that the nickel layer 14b must be formed between the copper layer 14a and the gold layer 14c to strengthen the structural strength of the composite metal layer 14. Likewise, the nickel layer 16b also must be formed between the copper layer 16a and the gold layer 16c to strengthen the structural strength of the composite metal layer 16. Since it is necessary to form the nickel layers 14b and 16b, manufacturing processes become more complicated and production costs are thereby increased.

SUMMARY OF INVENTION

It is therefore one object of the claimed invention to provide an LED to solve the above-mentioned problem.

According to the claimed invention, an LED is provided. The LED comprises a surface mounted package, a printed circuit board, and two solder paste layers. The surface mounted package includes a substrate having a first surface and a second surface, two composite metal layers insulated from each other and respectively extending from the first surface to the second surface, a light-emitting diode chip electrically connected to the composite metal layers on the first surface, and a sealing member covering the light-emitting diode chip and adhering to a portion of the substrate and to a portion of each composite metal layer. Each of the composite metal layers includes a copper layer positioned on the substrate and a silver layer positioned on the copper layer, and the solder paste layers respectively cover portions of the composite metal layers for electrically connecting the printed circuit board to the composite metal layers on the second surface. Additionally, the silver layers are utilized for preventing the solder paste layers from penetrating into space between the sealing member and the composite metal layers and for reflecting light beams generated by the light-emitting diode chip.

It is an advantage over the prior art that the silver layers of the claimed invention can prevent the solder paste layers from penetrating into space between the sealing member and the composite metal layers and reflect light beams generated by the LED chip. Thus, the claimed invention can improve structural strength of the surface mounted package and increase luminous intensity of the LED chip.

These and other objects of the present invention will be apparent to those of ordinary skill in the art after having read the following detailed description of the preferred embodiment that is illustrated in the various figures and drawings.

DETAILED DESCRIPTION

Figure 4:
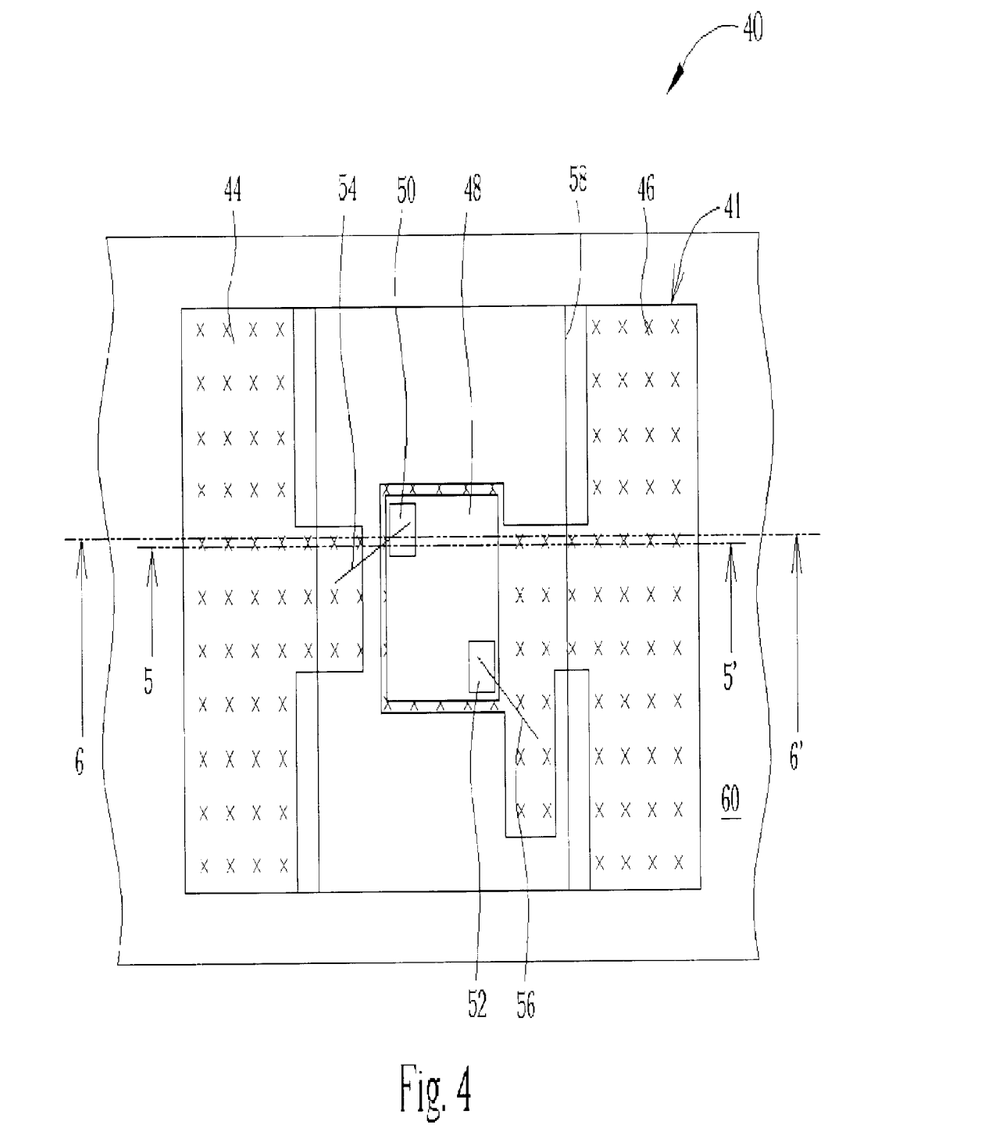
FIG. 4 is a top view of an LED according to the first embodiment of the present invention.
Figure 5:
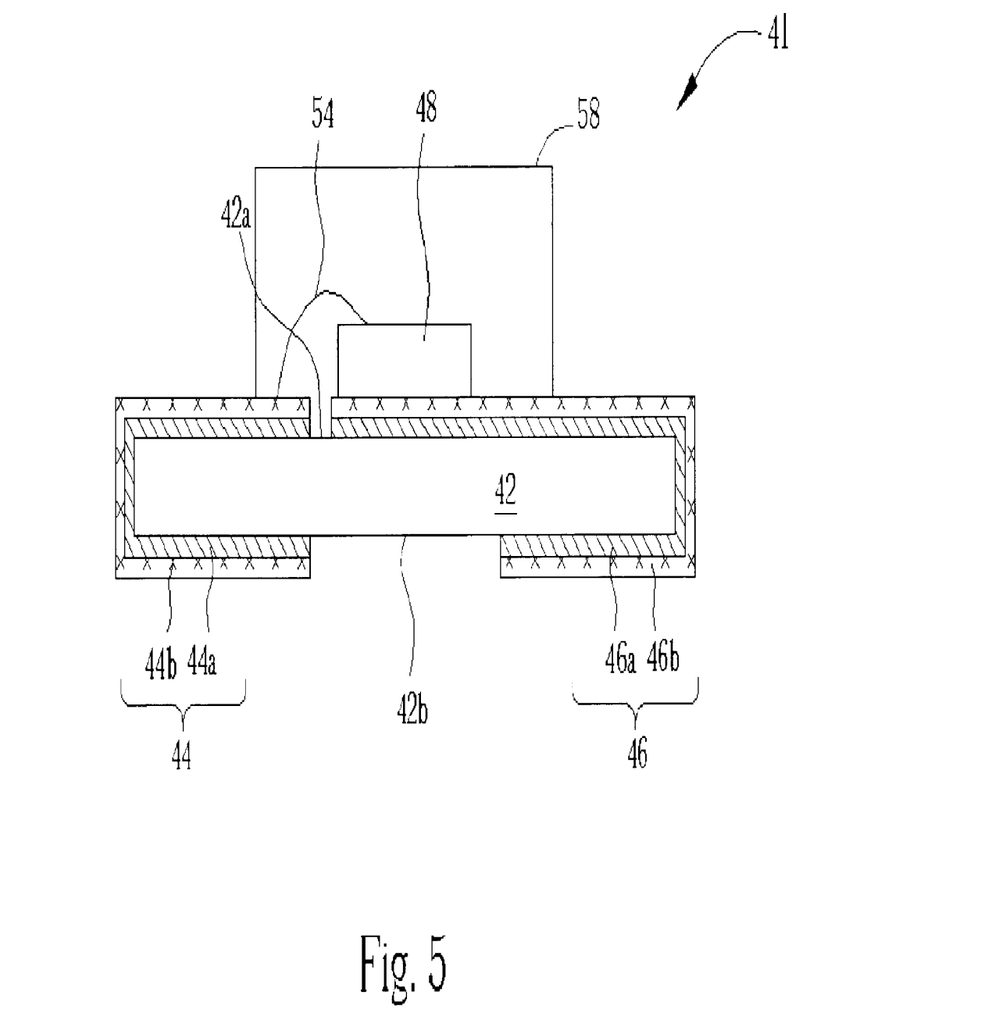
FIG. 5 is a sectional view along line 5—5 of the LED shown in FIG. 4.
Figure 6:
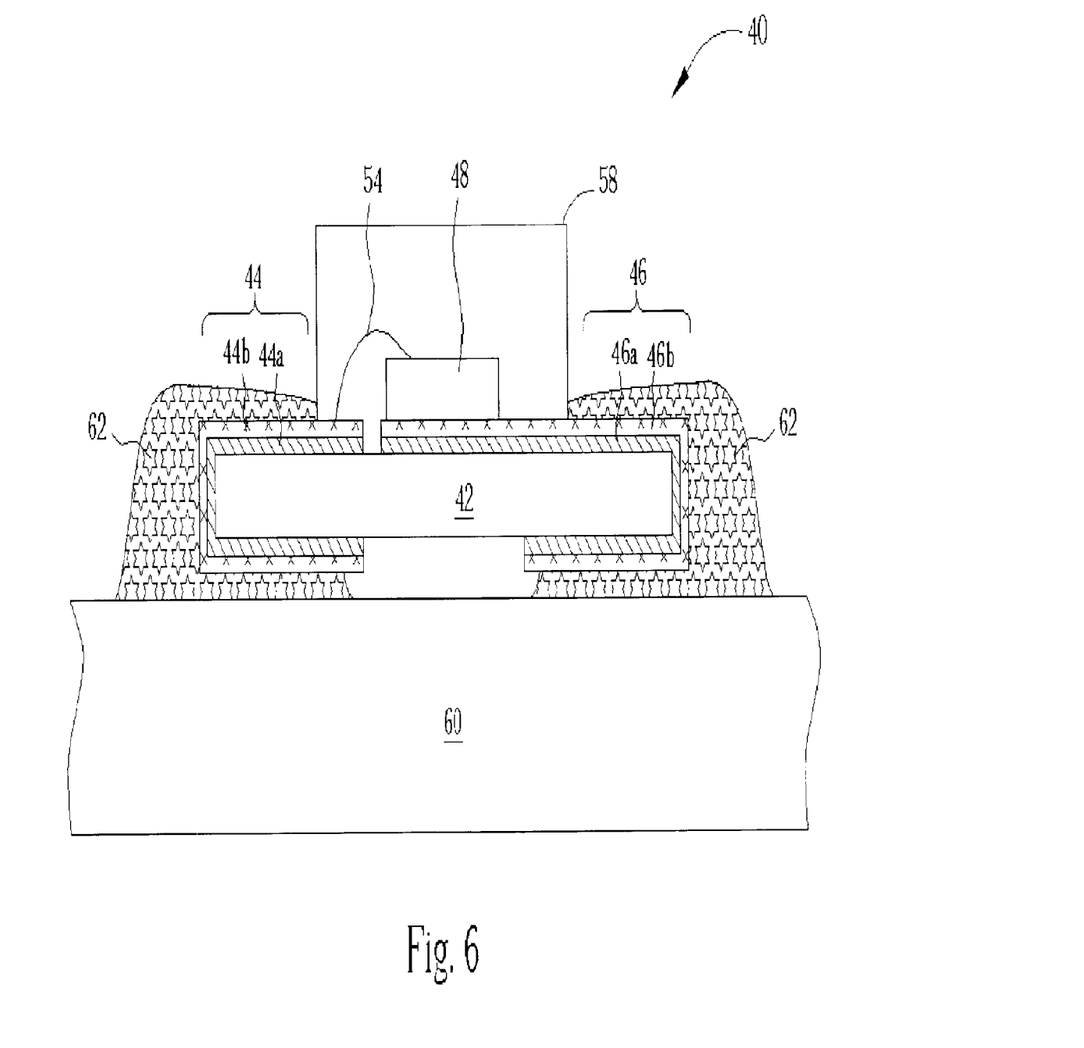
FIG. 6 is a sectional view along line 6—6 of the LED shown in FIG. 4.

Please refer to FIG. 4 to FIG. 6. FIG. 4 is a top view of an LED according to the first embodiment of the present invention. FIG. 5 is a sectional view along line 5—5 of the LED shown in FIG. 4. FIG. 6 is a sectional view along line 6-6" of the LED shown in FIG. 4. As shown in FIG. 4, an LED 40 comprises a printed circuit board 60, and a surface mounted package 41 positioned on the printed circuit board 60. As shown in FIG. 5, the surface mounted package 41 includes an insulation substrate 42 having an upper surface 42a and a lower surface 42b, two composite metal layers 44 and 46 that are insulated from each other and positioned on the substrate 42, an LED chip 48 electrically connected to the composite metal layers 44 and 46, and a sealing member 58 located on the substrate 42 and covering the LED chip 58. As shown in FIG. 4, the LED chip 48 has a p-electrode 50 electrically connected to the composite metal layer 44 via a conductive wire 54, and an n-electrode 52 electrically connected to the composite metal layer 46 via a conductive wire 56. The conductive wires 54 and 56 both comprise any kinds of metals with good conductivity, such as gold. The p-electrode 50 and the n-electrode 52 are used to receive a driving voltage, which drives electrons and holes in the LED chip 48 to be combined at PN junction for emitting light beams. Additionally, a structure of the LED chip 48 comprises a double hetero structure, a single hetero structure, or a homo structure, and the substrate 42 comprises a plastic substrate, a ceramic substrate, or a substrate made by other insulation materials.

As shown in FIG. 5, the composite metal layers 44 and 46 are used as conductive wires for connecting the LED chip 48 to an external circuit. The composite metal layer 44 includes a copper layer 44a positioned on the substrate 42 and extending from the upper surface 42a to the lower surface 42b, and a silver layer 44b located over the copper layer 44a. Likewise, the composite metal layer 46 also includes a copper layer 46a and a silver layer 46b. Additionally, a portion of the composite metal layer 46 is located between the LED chip 48 and the substrate 42 for reflecting light beams generated by the LED chip 48 and transmitting heat energy generated by the LED chip 48 to an ambient environment. In the preferred embodiment of the present invention, the sealing member 58 comprises transparent epoxy and is used to protect the LED chip 48, and the conductive wires 54 and 56. Additionally, the sealing member 58 can be mixed with phosphors according to requirements of products. For example, if the LED chip 48 emits blue light, the sealing member 58 can be mixed with yellow phosphors for making the LED 40 generate white light. Furthermore, the sealing member 58 can be mixed with diffuser for smoothing the light beams generated by the LED chip 48.

As shown in FIG. 6, the LED 40 further comprises a plurality of solder paste layers 62 for electrically connecting the printed circuit board 60 to the silver layers 44b and 46b on the lower surface 42b, and the solder paste layers 62 are not shown in FIG. 4 but in FIG. 6 for avoiding confusion. Additionally, processes for forming the solder paste layers 62 are described as follows. Firstly, a solder layer (not shown) is printed on the printed circuit board 60, and the solder layer is heated to melt. Then, the substrate 42 is put upon the printed circuit board 60, and the composite metal layers 44 and 46 on the substrate 42 are in contact with the molten solder layer. Finally, the molten solder layer is cooled down to form the solder paste layers 62. In addition, when the LED 48 starts to emit light beams, a driving voltage is firstly output from the printed circuit board 60. Then, the driving voltage supplied by the printed circuit board 60 is input into the p-electrode 50 and the n-electrode 52 through the composite metal layers 44 and 46. Finally, the driving voltage drives electrons and holes in the LED chip 48 to be combined at PN junction for emitting light beams.

Noticeably, since a wetting characteristic between the solder paste layers 62 and the silver layers 44b, 46b is poorer than that between the solder paste layers 32 and the silver layers 14c, 16c in the prior art, a binding force between the solder paste layers 62 and the silver layers 44b, 46b is smaller than that between the solder paste layers 32 and the silver layers 14c, 16c. Accordingly, the binding force between the solder paste layers 62 and the silver layers 44b, 46b approaches that between the sealing member 58 and the silver layers 44b, 46b, so that the sealing member 58 can be bonded to the silver layers 44b, 46b quite well and cracks are not formed between the sealing member 58 and the silver layers 44b, 46b. As a result, the solder paste layers 62 can be prevented from penetrating into space between the sealing member 58 and the silver layers 44b, 46b, thereby preventing the conductive wires 54 and 56 from being damaged and avoiding leakage current. Additionally, silver can reflect light beams of all kinds of wavelengths quite well. That is, silver can reflect visible light and light beams whose wavelength is shorter than 400 nm excellently, so that luminous intensity of the LED chip 48 can be improved because of the silver layers 44b and 46b. Furthermore, a combination between silver and copper is so good that the silver layers 44b and 46b can be directly formed on the copper layers 44a and 46a respectively. That is to say, each of the composite metal layers 44 and 46 only includes two metal layers, so that a manufacturing process for forming the substrate 42 is simplified and a production cost for forming the LED 40 is decreased.

Figure 7:
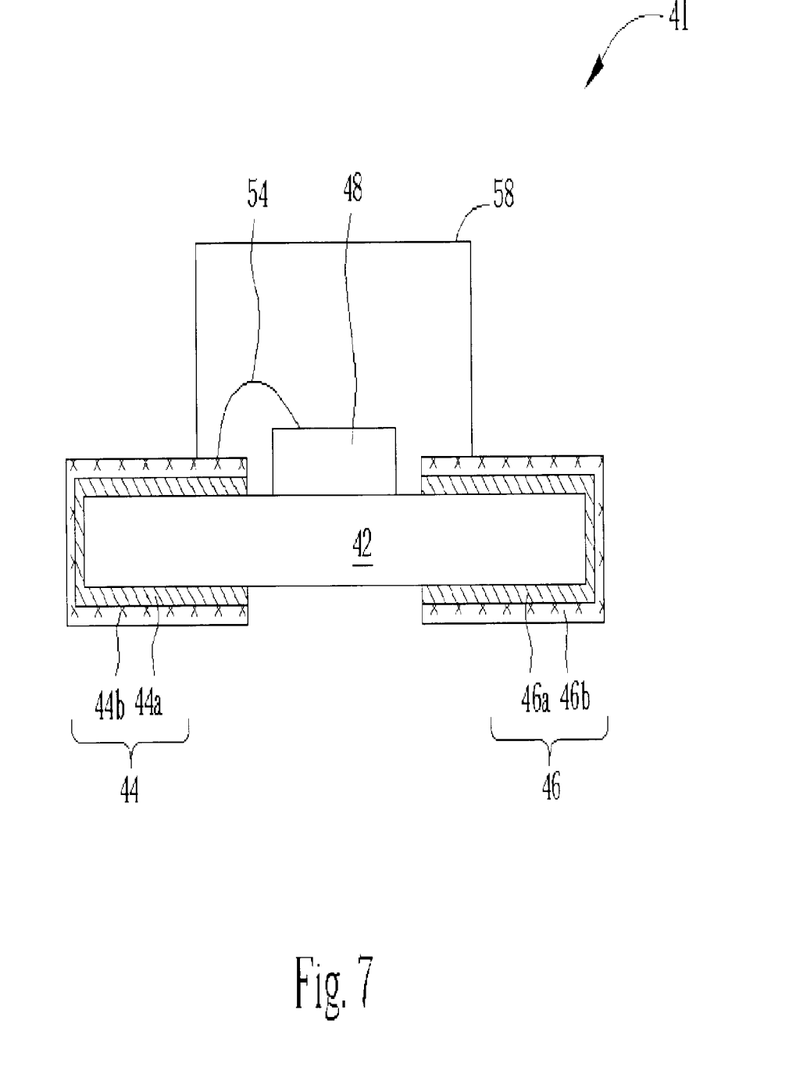
FIG. 7 is a sectional view of a surface mounted package according to the second embodiment of the present invention.
Figure 8:
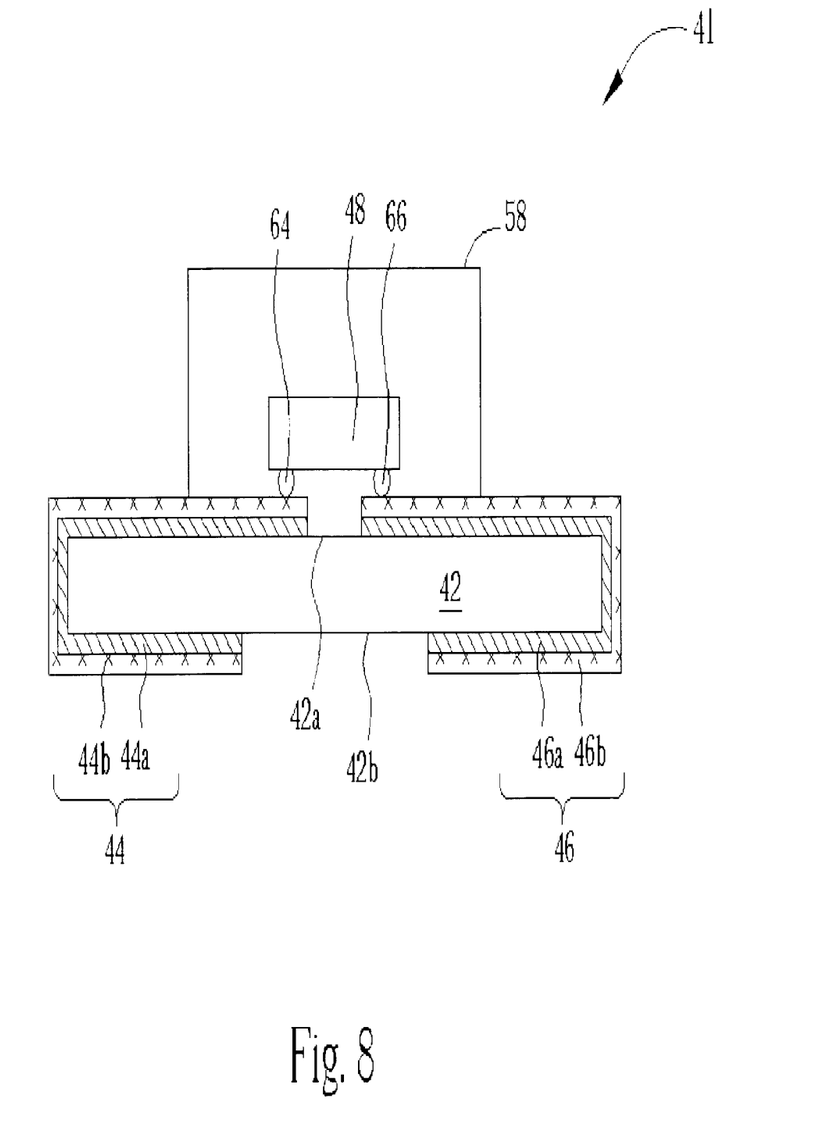
FIG. 8 is a sectional view of a surface mounted package according to the third embodiment of the present invention.

In addition, the structure of the surface mounted package 41 is not limited to that shown in FIG. 4 to 6, and the following description will introduce other embodiments of the present invention. Please refer to FIG. 7. For convenience of explanation, the same elements of FIG. 7 to FIG. 8 are indicated by the same symbols. FIG. 7 is a sectional view of a surface mounted package according to the second embodiment of the present invention. As shown in FIG. 7, the substrate 42 is a substrate capable of reflecting light beams and conducting heat, and the composite metal layer 46 does not extend to the space between the LED chip 48 and the substrate 42. Please refer to FIG. 8. FIG. 8 is a sectional view of a surface mounted package according to the third embodiment of the present invention. As shown in FIG. 8, the surface mounted package 41 further comprises a plurality of solder balls 64 and 66 for electrically connecting the LED chip 48 to the composite metal layers 44 and 46. That is to say, the LED chip 48 is connected to the composite metal layers 44 and 46 through using a flip chip (FC) method in the third embodiment of the present invention. Furthermore, in the above-mentioned embodiments, the copper layers 44a and 46a can be omitted. In other words, the silver layers 44b and 46b can be directly formed on the substrate 42.

In comparison with surface mounted package 11 of the prior art, the gold layers 14c and 16c are replaced with the silver layers 44b and 46b in the surface mounted package 41. Since the binding force between the solder paste layers 62 and the silver layers 44b, 46b is close to that between the sealing member 58 and the silver layers 44b, 46b, the sealing member 58 can be combined with the silver layers 44b and 46b tightly, thereby preventing cracks forming between the sealing member 58 and the silver layers 44b, 46b. As a result, the structural strength of the package 41 can be improved and a lifetime of the LED chip 48 can be prolonged. Additionally, because silver can reflect light beams of all kinds of wavelengths quite well, luminous intensity of the LED chip 48 can be improved owing to the silver layers 44b and 46b. Furthermore, since the silver layers 44b and 46b are directly formed on the copper layers 44a and 46a respectively, a manufacturing process for forming the substrate 42 is simplified and a production cost for forming the LED 40 is reduced.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A light-emitting diode comprising:
   a surface mounted package comprising:
      a substrate having a first surface and a second surface;
      two composite metal layers insulated from each other and respectively extending from the first surface to the second surface, each of the composite metal layers having a copper layer positioned on the substrate and a silver layer positioned on the copper layer;
      a light-emitting diode chip electrically connected to the composite metal layers on the first surface; and
      a sealing member covering the light-emitting diode chip and adhering to a portion of the substrate and to a portion of each composite metal layer;
   a printed circuit board; and
   two solder paste layers respectively covering portions of the composite metal layers for electrically connecting the printed circuit board to the composite metal layers on the second surface;
   wherein the silver layers are utilized for preventing the solder paste layers from penetrating into space between the sealing member and the composite metal layers and for reflecting light beams generated by the light-emitting diode chip.

2. The light-emitting diode of claim 1 further comprising a plurality of solder balls for electrically connecting the light-emitting, diode chip to the composite metal layers.

3. The light-emitting diode of claim 1 further comprising a plurality of conductive wires for electrically connecting the light-emitting diode chip to the composite metal layers.

4. The light-emitting diode of claim 3 wherein at least one of the composite metal layers is extended to space between the light-emitting diode chip and the substrate for reflecting light beams generated by the light-emitting diode chip and for transmitting heat energy generated by the light-emitting diode chip to an ambient environment.

5. The light-emitting diode of claim 1 wherein the substrate is an insulation substrate.

6. The light-emitting diode of claim 5 wherein the insulation substrate comprises a plastic substrate or a ceramic substrate.

7. The light-emitting diode of claim 3 wherein each of the conductive wires comprises gold (Ag).

8. A light-emitting device comprising:
   a surface mounted package comprising:
      a substrate having a first surface and a second surface;
      two metal layers insulated from each other and positioned on the substrate, the metal layers respectively extending from the first surface to the second surface, each of the metal layers comprising a silver layer positioned on the substrate;
      a chip electrically connected to the metal layers on the first surface; and
      a sealing member covering the chip and adhering to a portion of the substrate and to portions of the metal layers;
   a printed circuit board; and
   two solder paste layers for electrically connecting the printed circuit board to the metal layers on the second surface;
   wherein the silver layers are utilized for preventing the solder paste layers from penetrating into space between the scaling member and the metal layers.

9. The light-emitting device of claim 8 wherein the chip comprises a light-emitting diode chip.

10. The light-emitting device of claim 9 wherein each of the metal layers further comprises a copper layer positioned between the substrate and the silver layers.

11. The light-emitting device of claim 9 further comprising a plurality of solder balls for electrically connecting the light-emitting diode chip to the metal layers.

12. The light-emitting device of claim 9 further comprising a plurality of conductive wires for electrically connecting the light-emitting diode chip to the metal layers.

13. The light-emitting device of claim 12 wherein at least one of the metal layers is extended to space between the light-emitting diode chip and the substrate for reflecting light beams generated by the light-emitting diode chip and transmitting heat energy generated by the light-emitting diode chip to an ambient environment.

14. The light-emitting device of claim 9 wherein the substrate is an insulation substrate.

15. The light-emitting device of claim 14 wherein the insulation substrate comprises a plastic substrate or a ceramic substrate.

16. The light-emitting device of claim 12 wherein each of the conductive wires comprises gold.

* * * * *